(12) United States Patent
Lee et al.

(10) Patent No.: US 6,897,159 B1
(45) Date of Patent: May 24, 2005

(54) METHOD FOR FABRICATING SEMICONDUCTOR DEVICE

(75) Inventors: Sung-Kwon Lee, Ichon-shi (KR); Min-Suk Lee, Ichon-shi (KR)

(73) Assignee: Hynix Semiconductor Inc., Kyoungki-Do (KR)

(*) Notice: Subject to any disclaimer, the term of this patent is extended or adjusted under 35 U.S.C. 154(b) by 0 days.

(21) Appl. No.: 10/878,289

(22) Filed: Jun. 29, 2004

(30) Foreign Application Priority Data

Nov. 28, 2003 (KR) .................................. 10-2003-0085816

(51) Int. Cl.$^7$ ............................................. H01L 21/302
(52) U.S. Cl. .................. 438/714; 438/723; 438/724; 438/734; 438/740
(58) Field of Search ................... 438/700, 714, 438/723, 724, 734, 740

(56) References Cited

U.S. PATENT DOCUMENTS

| | | | |
|---|---|---|---|
| 6,362,109 B1 * | 3/2002 | Kim et al. .................. 438/706 |
| 6,518,164 B1 * | 2/2003 | Wu et al. .................. 438/618 |
| 6,569,778 B2 * | 5/2003 | Lee et al. .................. 438/734 |
| 2001/0005634 A1 * | 6/2001 | Kajiwara .................. 438/706 |
| 2003/0181054 A1 * | 9/2003 | Lee et al. .................. 438/709 |

* cited by examiner

Primary Examiner—George A. Goudreau
(74) Attorney, Agent, or Firm—Finnegan, Henderson, Farabow, Garrett, & Dunner, L.L.P.

(57) ABSTRACT

Disclosed is a method for fabricating a semiconductor device having at least one contact holes formed by employing a self-aligned contact (SAC) etching process. The contact holes are formed through the shortened number of sequential steps by using different process recipes. First, an anti-reflective coating (ARC) layer formed on a substrate structure prepared sequentially with a substrate, conductive structures, an etch stop layer and an inter-layer insulation layer is etched by employing an etch gas of $CF_4$, $O_2$, CO and Ar. Then, a portion of an inter-layer insulation layer is etched with use of an etch gas of $CF_4$ and $O_2$. The rest portion of the inter-layer insulation layer is subsequently etched by using a different etch gas of $C_4F_6$, $CH_2F_2$, $O_2$ and Ar to thereby form at least one contact hole exposing the etch stop layer.

22 Claims, 9 Drawing Sheets

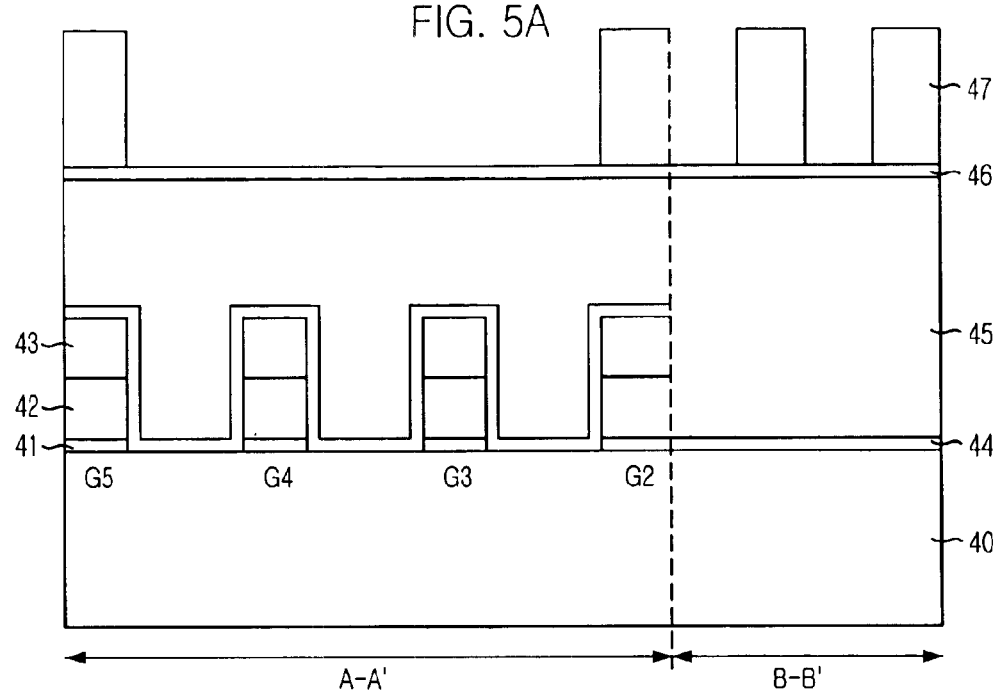
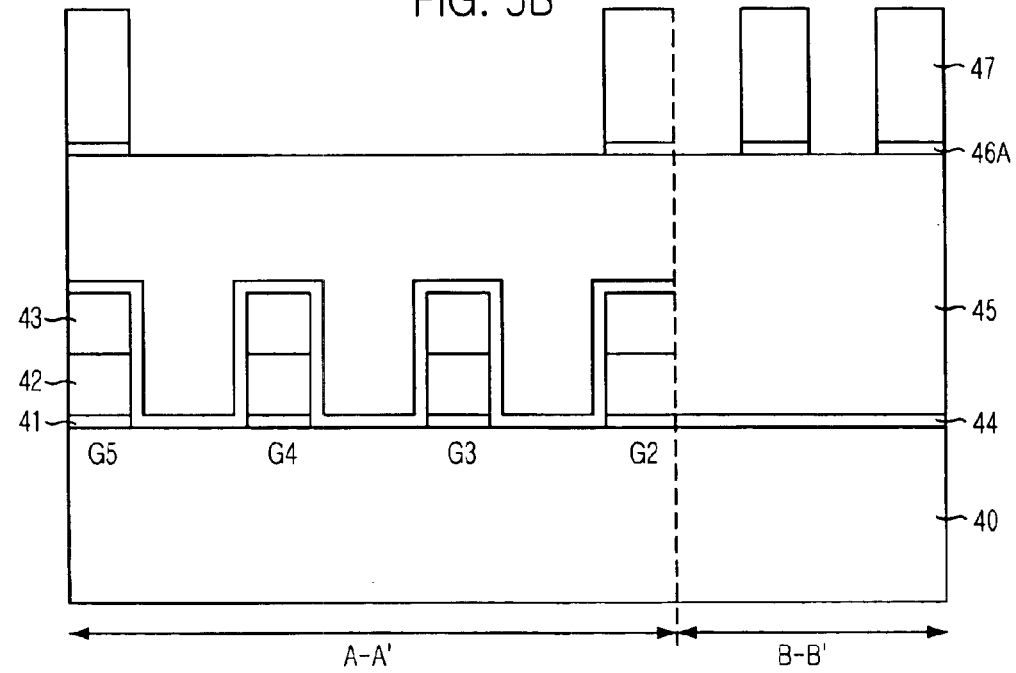

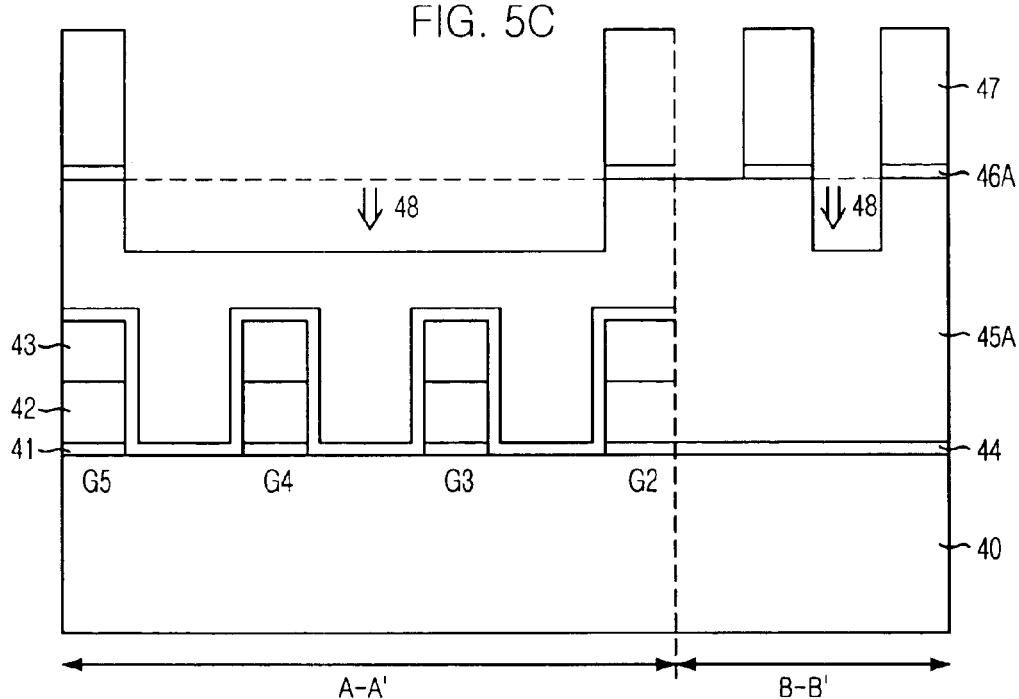
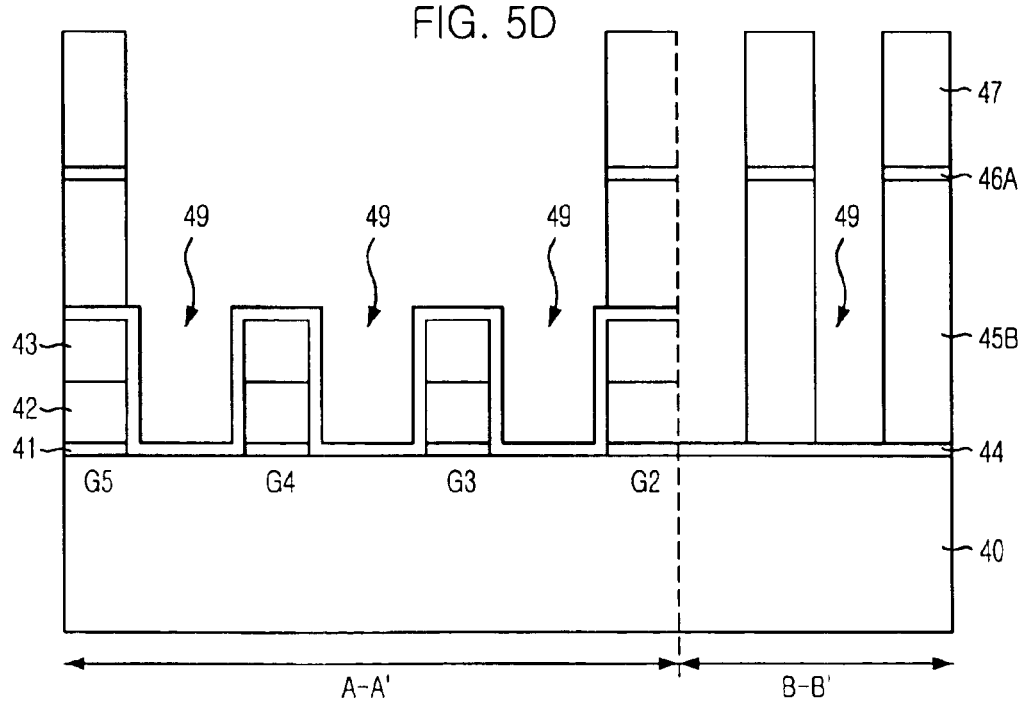

//METHOD FOR FABRICATING
SEMICONDUCTOR DEVICE

FIELD OF THE INVENTION

The present invention relates to a method for fabricating a semiconductor device; and, more particularly, to a method for forming a self-aligned contact in a semiconductor device.

DESCRIPTION OF RELATED ARTS

Typically, a semiconductor device is formed with a number of unit device elements. As a semiconductor device has been highly integrated, sizes of such unit device elements as transistors and capacitors have proportionally decreased. Particularly, in a dynamic random access memory (DRAM) device, decrease in a design rule has led to decrease in sizes of semiconductor devices formed in cells. For instance, a linewidth of a current DRAM device is formed in a size less than 0.1 μm, and more extremely, the required down-size of the linewidth is less than 80 nm. Therefore, there are numerous difficulties to advance the development of a DRAM device with the required size of the linewidth.

If a photolithography process using a light source of ArF having a wavelength of 193 nm is applied in a semiconductor device having a linewidth less than 80 nm, it is additionally necessary to suppress a photoresist from being deformed during an etching process performed under the target of providing a precisely shaped pattern and a vertical etch profile. Therefore, a current focus of the semiconductor technology is to develop a process recipe of the etching process that satisfies both the requirements for achieving the above described target and for suppressing the pattern deformation.

Meanwhile, acceleration in the scale of integration in a semiconductor device brings out a need to form various device elements of the semiconductor device in stacks. One example of this stack structure is a contact plug.

For forming such a contact plug, a landing plug contact (LPC) is commonly formed since the LPC has a bottom portion which makes a wide contact within a minimum area and a top portion which is wider than the bottom portion to increase a contact margin.

A self-aligned contact (SAC) etching process is adopted to form a LPC between structures having a high aspect ratio. The SAC etching process is a method of forming a contact by performing an etching process to a bottom structure having a specific etch selectivity ratio. Generally, the SAC etching process uses different etch selectivity ratios between nitride and oxide.

Detailed description on the SAC etching process is disclosed in U.S. Pat. No. 4,992,848 issued to Gen M. Chin on Feb. 12, 1991, entitled "Self-Aligned Technology," and in an article by Y. Kohyama, entitled "A Fully Printable, Self-Aligned and Planarized Stacked Capacitor DRAM Cell Technology for 1 G bit DRAM and Beyond," *Digest of Technical Papers*, 17–18, (1997). However, as the scale of integration of a semiconductor device has increased, there has been a vigorous study on photolithography using a light source of ArF. However, a photoresist for use in an ArF photolithography device has a weaker tolerance to an etching process compared with a photoresist for use in a KrF photolithography device.

FIGS. 1A and 1B are micrographs of scanning electron microscopy (SEM) showing defective ArF photoresist patterns caused by a SAC etching process.

Referring to FIG. 1A, a plurality of bar type patterns formed by an ArF photolithography process become wiggled, and a reference numeral 10A denotes the wiggled photoresist pattern. Also, referring to FIG. 1B, a plurality of bar type patterns formed by an ArF photolithography process become striated, and a reference numeral 10B denotes the striated photoresist pattern. These shown pattern deformation problems of wiggling and striation are caused by characteristics of the ArF photoresist.

To solve these problems, a SAC etching process using a gas of $C_4F_6$ is suggested. Especially, fluorocarbons for easily producing polymers, especially those fluorocarbons having a low ratio of fluorine to carbon, are used to minimize damage to a pattern during a SAC etching process and to compensate a gate hard mask which may be damaged during the SAC etching process. Among those fluorocarbons, $C_5F_8$ and $C_4F_6$ are in a current focus. For instance, when a magnetically enhanced reactive ion etching (MERIE) apparatus is employed for the SAC etching process, a gas of $C_4F_6$ is used for obtaining such effects. This SAC etching process performed by using the $C_4F_6$ gas at the MERIE apparatus is described in U.S. Pat. No. 6,174,451 issued to R. Hung et al. on Jan. 16, 2001, entitled "Oxide Etch Process Using Hexafluorobutadiene and Related Unsaturated Hydrofluorocarbons" and in U.S. Pat. No. 6,387,287 issued to R. Hung et al. on May 14, 2002, entitled "Process for Etching Oxide Using Hexafluorobutadiene and Manifesting Wide Process Window." Herein, the U.S. Pat. No. 6,174,451 and the U.S. Pat. No. 6,387,287 are referred to as a cited reference 1 and a cited reference 2, respectively.

FIG. 2 is a flowchart showing detailed steps involved in the SAC etching process described in the cited references 1 and 2.

As shown, the SAC etching process according to the cited references 1 and 2 includes a main etching step S20, an over-etching step S21, an ashing process 522 and an etch stop layer removing step S23. At the main etching step S20, an oxide layer is etched until a gate hard mask of a gate structure is exposed by using a photoresist pattern as an etch mask. At this time, $C_4F_6$ and Ar gases are used as an etch gas for the SAC etching process. Then, at the over-etching step S21, the remaining portion of the oxide layer is etched again by using $C_4F_6$, $CH_2F_2$ and Ar. At the ashing process S22, the photoresist pattern is removed by using $O_2$, and at the etch stop layer removing step S23, the etch stop layer made of a nitride-based material is removed by using a gas of $CH_2F_2$, $O_2$ and Ar.

Meanwhile, in the cited references 1 and 2, since the SAC etching process proceeds under a high power over 1500 W and an electrode temperature greater than a room temperature, it is possible to employ this process recipe in a KrF photolithography process. However, it may be practically impossible to employ this process recipe in an ArF photolithography process which should be carried out at a low power in order to prevent the pattern deformation.

In U.S. Pat. No. 6,362,109 issued to Yungsang Kim et al. on Mar. 26, 2002, entitled "Oxide/Nitride Etching Having High Selectivity to Photoresist," the use of a mixed etch gas of $C_4F_6$, $CH_2F_2$, $O_2$ and CO is described. This process recipe is applicable to a KrF photolithography process with use of a high power greater than 1500 W. However, it may be practically difficult to employ this process recipe in an ArF photolithography process, which should be carried out at a low power in order to prevent the pattern deformation.

Also, etching an oxide layer with use of a fluorocarbon gas containing fluorine and carbon in a ratio of less than 2 to 1, e.g., $C_4F_6$, is introduced in U.S. Pat. No. 6,326,307 issued to R. A. Lindley on Dec. 4, 2001, entitled "Plasma Pretreatment of Photoresist in an Oxide Etch Process." When the oxide layer is etched, a plasma pretreatment proceeds prior to performing a main etching process in order to minimize striation. However, this process recipe is also applicable to a KrF photolithography process with use of high power. However, it may be difficult to employ this process recipe in an ArF photolithography process, which should be carried out at a low power in order to prevent the pattern deformation.

FIGS. 3A and 3B are micrographs of SEM respectively showing a cross-sectional view and a top view of a substrate structure obtained after an anti-reflective coating layer formed on an inter-layer insulation layer is etched by using an etch gas of $CHF_3$, $CF_4$ and $O_2$, or an etch gas of $C_4F_6$, $O_2$ and Ar. This etching process is carried out for approximately 55 seconds. Also, the above etch gas is obtained by mixing approximately 40 sccm of $CHF_3$ gas, approximately 10 sccm of $CF_4$ gas and approximately 8 sccm of $O_2$ gas. At this time, a power of approximately 300 W and a chamber pressure of approximately 50 mTorr are provided along with maintaining an electrode temperature and a temperature of inner walls of a chamber at approximately 15° C. and approximately 60° C., respectively. As shown, under this process recipe, photoresist patterns become deformed more frequently.

SUMMARY OF THE INVENTION

It is, therefore, an object of the present invention to provide a method for fabricating a semiconductor device capable of preventing pattern deformation even if an ArF photolithography process is applied during a self-aligned contact (SAC) process.

In accordance with an aspect of the present invention, there is provided a method for fabricating a semiconductor device, including the steps of: (a) forming a plurality of conductive structures on a substrate; (b) forming an etch stop layer on a substrate structure including the substrate and the conductive structures; (c) forming an inter-layer insulation layer on the etch stop layer; (d) sequentially forming an anti-reflective coating layer and a photoresist pattern on the inter-layer insulation layer; (e) etching the anti-reflective coating (ARC) layer by employing the photoresist pattern as an etch mask along with use of an etch gas of $CF_4$, $O_2$, CO and Ar; (f) etching a portion of the inter-layer insulation layer by employing the photoresist pattern and the ARC layer as an etch mask along with use of an etch gas of $CF_4$ and $O_2$; (g) etching the inter-layer insulation layer by employing the photoresist pattern and the ARC layer as an etch mask along with use of an etch gas of $C_4F_6$, $CH_2F_2$, $O_2$ and Ar to thereby form at least one contact hole exposing the etch stop layer; and (h) removing the exposed etch stop layer.

In accordance with another aspect of the present invention, there is provided a method for fabricating a semiconductor device, including the steps of: (a) forming a plurality of conductive structures on a substrate; (b) forming an etch stop layer on a substrate structure including the conductive structures and the substrate; (c) forming an inter-layer insulation layer on the etch stop layer; (d) sequentially forming an anti-reflective coating (ARC) layer and a photoresist pattern on the inter-layer insulation layer; (e) etching the ARC layer and a portion of the inter-layer insulation layer by employing the photoresist pattern as an etch mask along with use of an etch gas of $CF_4$ and $O_2$; (f) etching the inter-layer insulation layer by employing the photoresist pattern and the ARC layer as an etch mask along with use of an etch gas of $C_4F_6$, $CH_2F_2$, $O_2$ and Ar to thereby form at least one contact hole exposing the etch stop layer; and (g) removing the exposed etch stop layer.

BRIEF DESCRIPTION OF THE DRAWINGS

The above and other objects and features of the present invention will become better understood with respect to the following description of the preferred embodiments given in conjunction with the accompanying drawings, in which:

FIGS. 5A to 5E are cross-sectional views showing a method for fabricating a semiconductor device in accordance with the preferred embodiment of the present invention;

DETAILED DESCRIPTION OF THE INVENTION

A method for fabricating a semiconductor device in accordance with a preferred embodiment of the present invention will be described in detail with reference to the accompanying drawings.

Figure 4:
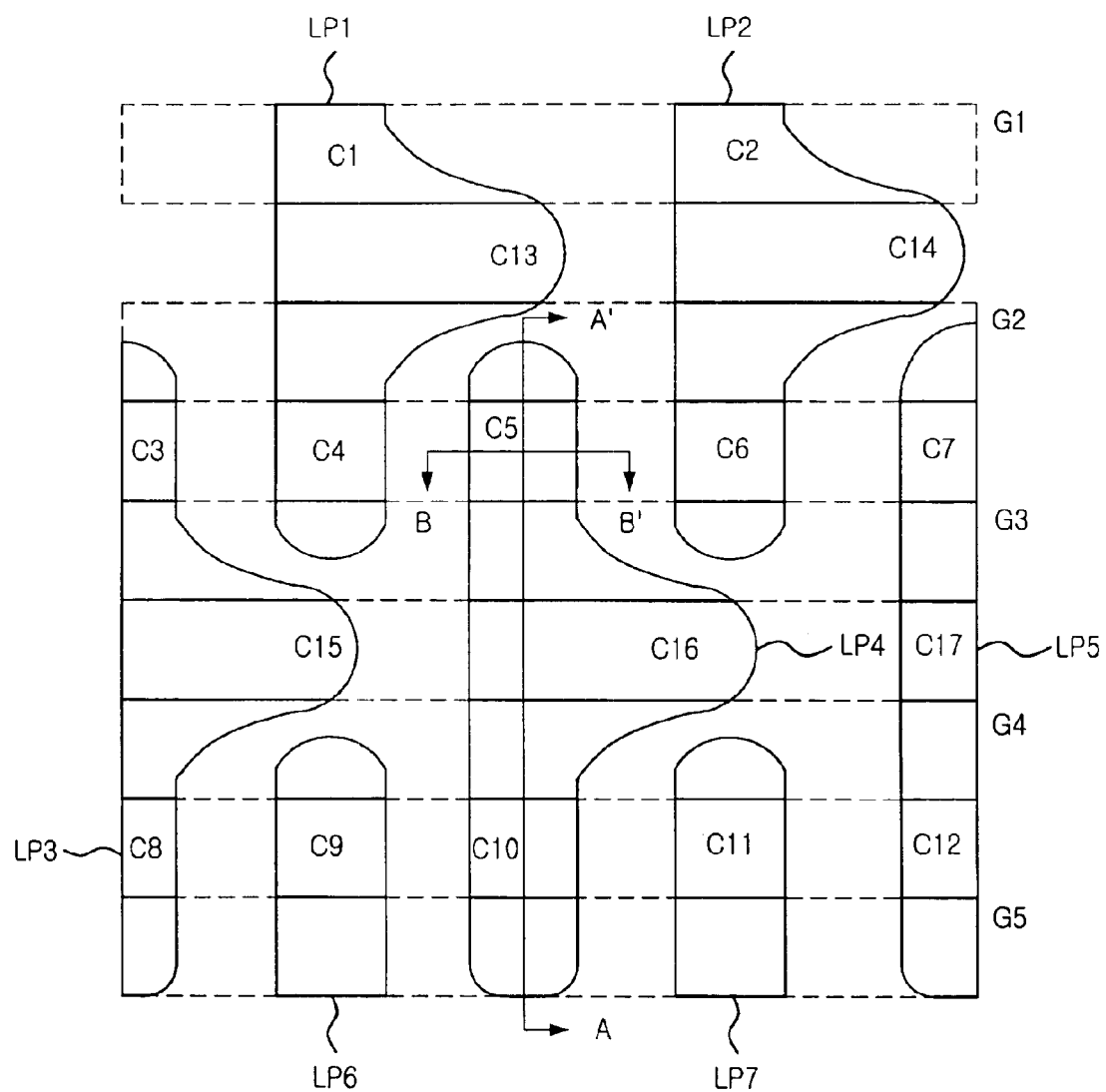
FIG. 4 is a top view showing a layout of a semiconductor device obtained after a SAC etching process for forming a landing plug contact in accordance with a preferred embodiment of the present invention.

FIG. 4 is a diagram showing a layout of a semiconductor device obtained after a self-aligned contact (SAC) etching process.

As shown, a plurality of gate electrodes G1 to G5 are arranged in a uniform distance. In a crossing direction to the gate structures G1 to G5, a plurality of T-type landing plugs LP1 to LP7 are formed by arranging a set of contact hole C1 to C17 in the form of T. Herein, the reference numerals from LP1 to LP7 represent a first to a seventh landing plugs, respectively. Each of the first to the seventh landing plugs LP1 to LP7 includes three contact holes. For instance, in the first landing plug LP1, contact holes for storage node contacts are denoted as C1 and C4, while a contact for a bit line contact is denoted as C13. That is, reference denotations C1 to C12 represent contact holes for storage node contacts, while reference denotations C13 to C17 represent contact holes for bit line contacts.

Meanwhile, although not illustrated, an inter-layer insulation layer is formed on the gate structures G1 to G5 disposed between each two of the first to the seventh landing plugs LP1 to LP7.

Hereinafter, detailed description on a method for fabricating a semiconductor device will be provided with reference to FIGS. 5A to 5E showing cross-sectional views of FIG. 4 taken along a direction of a line A–A' and a line B–B'.

A plurality of gate structures G2 to G5 are formed on a substrate 40 provided with various device elements. Each of the gate structures G2 to G5 includes a gate hard mask 43, a gate conductive layer 42 and a gate insulation layer 41.

Herein, the gate insulation layer 41 is made of a typical oxide-based material such as silicon oxide. The gate conductive layer 42 is made of a material selected in single or in combination from a group consisting of polysilicon, tungsten (W), tungsten nitride ($WN_x$) and tungsten silicide ($Wsi_x$).

The gate hard mask 43 serves a role in preventing the gate conductive layer 42 from being damaged in the course of forming contact holes by etching a subsequent inter-layer insulation layer. Thus, the gate hard mask 43 is made of a material having a highly different etch selectivity from the above mentioned inter-layer insulation layer. For instance, if the inter-layer insulation layer is made of an oxide-based material, the gate hard mask 43 is made of a nitride-based material such as silicon nitride (SiN) or silicon oxynitride (SiON). If the inter-layer insulation layer is made of a polymer-based low dielectric material, the gate hard mask 43 is made of an oxide-based material.

Although not illustrated, impurity diffusion regions such as source/drain junctions are formed in the substrate 40 disposed between each two of the gate structures G2 to G5.

More specific to the formation of the impurity diffusion regions, impurities are first implanted into the substrate 40 through an ion implantation process performed in alignment to the gate structures G2 to G5. A plurality of spacers are formed on sidewalls of the gate structure G2 to G5. Then, another ion implantation process is performed to form lightly doped drain (LDD) structures. Herein, more detailed descriptions on the respective ion-implantation processes for forming the LDD structures and the impurity diffusion regions and the spacer formation process are omitted.

An etch stop layer 44 for protecting the substrate 40 against damages occurring during a self-aligned contact (SAC) etching process is formed on the above resulting substrate structure. At this time, the etch stop layer 44 is preferably formed along a profile of the gate structures G2 to G5 and is made of a nitride-based material such as silicon nitride or silicon oxynitride. At this time, a preferable thickness of the etch stop layer 44 ranges from approximately 50 Å to approximately 500 Å.

Next, the aforementioned inter-layer insulation layer 45 is formed on the etch stop layer 44. Herein, the inter-layer insulation layer 45 is made of an oxide-based material selected in single or in combination from a group consisting of borophosphosilicate glass (BPSG), borophosphosilicate glass (BSG), phosphosilicate glass (PSG), tetraethylorthosilicate (TEOS), high density plasma (HDP) oxide, spin on glass (SOG) and advanced planarization layer (APL).

Then, an anti-reflective coating layer 46 is formed on the inter-layer insulation layer 45. The anti-reflective coating layer 46 is formed for the purpose of preventing formation of an undesired pattern, caused by scattering reflection generated because the inter-layer insulation layer 45 has a high index of reflection, during a photo-exposure process for forming a pattern and of improving adhesion between the inter-layer insulation layer 45 and a photoresist which will be used later. Thus, the anti-reflective coating layer 46 is formed between the photoresist and the inter-layer insulation layer 45. Also, the anti-reflective coating layer 46 is made of an organic-based material having a similar etch characteristic to the photoresist. That is, the anti-reflective coating layer 46 and the photoresist can be removed by oxygen plasma. Depending on the purpose of a process, the formation of the anti-reflective coating layer can be omitted.

The aforementioned photoresist is formed on the anti-reflective coating layer 46 by employing a spin on coating method. The photoresist is selectively photo-exposed with use of a predetermined reticle (not shown) for defining a width of a contact hole and an ArF or $F_2$ photolithography device. Then, a developing process makes photo-exposed portions or non-photo-exposed portions remain, and etch remnants are removed by a subsequent cleaning process, thereby forming a photoresist pattern 47 for forming a landing plug contact.

Also, it is also possible to form a hard mask between the inter-layer insulation layer 45 and the photoresist pattern 47, or between the inter-layer insulation layer 45 and the anti-reflective coating layer 46. At this time, the hard mask is formed with one of a nitride-based insulating material and a conductive material such as tungsten or polysilicon. In case of using the nitride-based insulating material, the hard mask preferably has a thickness ranging from approximately 300 Å to approximately 2000 Å.

Referring to FIG. 5B, the anti-reflective coating layer 46 shown in FIG. 5A is etched by using the photoresist pattern 47 as an etch mask, so that a patterned anti-reflective coating layer 46A is formed. At this time, such a gas of $CF_4$, CO, $O_2$ and Ar is used as an etch gas, and this etching process proceeds at a power lower than the power used in a KrF photolithography process.

A process recipe employed in the KrF photolithography process is provided in Table 1 below.

TABLE 1

| Recipe Steps | Process | | | | | |
|---|---|---|---|---|---|---|
| | $C_4F_6$ (sccm) | $O_2$ (sccm) | Ar (sccm) | $CF_4$ (sccm) | Pressure (mTorr) | Power (W) |
| Anti-Reflective Coating Layer Etching process | | | | 100 | 100 | 300 |
| Main Etching process | 34 | 23 | 700 | | 60 | 1800 |

As shown, the KrF photolithography process uses a high power of approximately 300 W and approximately 1800 W in the step of etching the anti-reflective coating layer and in the step of main etching process, respectively.

However, the preferred embodiment exemplifies the use of $CF_4/CO/O_2$/Ar gas which provides effects of minimizing incidences of striation on patterns and maximizing a critical dimension (CD) of a bottom of an opening.

Referring to FIG. 5C, a portion of the inter-layer insulation layer 45 is etched with use of the photoresist pattern 47 and the patterned anti-reflective coating layer 46A as an etch mask. A reference numeral 48 denotes this partial etching of the inter-layer insulation layer 45 proceeding in vertical to the substrate 40, thereby providing a vertical etch profile. This vertical etch profile is advantageous in maximizing the CD of the bottom of the opening. Also, a reference numeral 45A denotes a remaining inter-layer insulation layer 45A.

Especially, for a preferable etch process recipe, $CF_4$ gas and $O_2$ gas are provided in a range from approximately 50 sccm to approximately 150 sccm and in a range from approximately 1 sccm to approximately 5 sccm, respectively. Also, the partial etching process proceeds under a power ranging from approximately 300 W to approximately 700 W and a pressure ranging from approximately 10 mTorr to approximately 50 mTorr. At this time, a temperature of an electrode ranges from approximately 0° C. to approximately 20° C., and a temperature of inner walls of a chamber ranges from approximately 40° C. to approximately 60° C.

Referring to FIG. 5D, the remaining inter-layer insulation layer 45A is etched with use of the photoresist pattern 47 and the patterned anti-reflective coating layer 46A as an etch mask, thereby forming a plurality of contact holes 49 exposing the etch stop layer 44 disposed between each two of the gate structures G2 to G5. This etching process is the step of the main etching process. Herein, a reference numeral 45B denotes a patterned inter-layer insulation layer after the step of the main etching process.

At this time, a gas of $C_4F_6$, $O_2$, Ar, and $CH_2O_2$ is used as an etch gas. Since the power used in this main etching process is lower than the above described partial etching process, the loss of the gate hard mask 43 and the etch stop layer 44 are minimized.

More specific to a preferable process recipe of the main etching process, $C_4F_6$ gas, $O_2$ gas, Ar gas and $CH_2F_2$ gas are provided in a range from approximately 5 sccm to approximately 15 sccm, in a range from approximately 2 sccm to 6 sccm, in a range from approximately 500 sccm to 1500 sccm, and in a range from approximately 2 sccm to approximately 5 sccm, respectively. At this time, a power ranging from approximately 500 W to approximately 1000 W is used, and a chamber of which inner wall temperature ranges from approximately 40° C. to approximately 60° C. is supplied with a pressure ranging from approximately 50 mTorr to approximately 100 mTorr. Also, a temperature of an electrode ranges from approximately 0° C. to approximately 20° C.

Figure 5E:
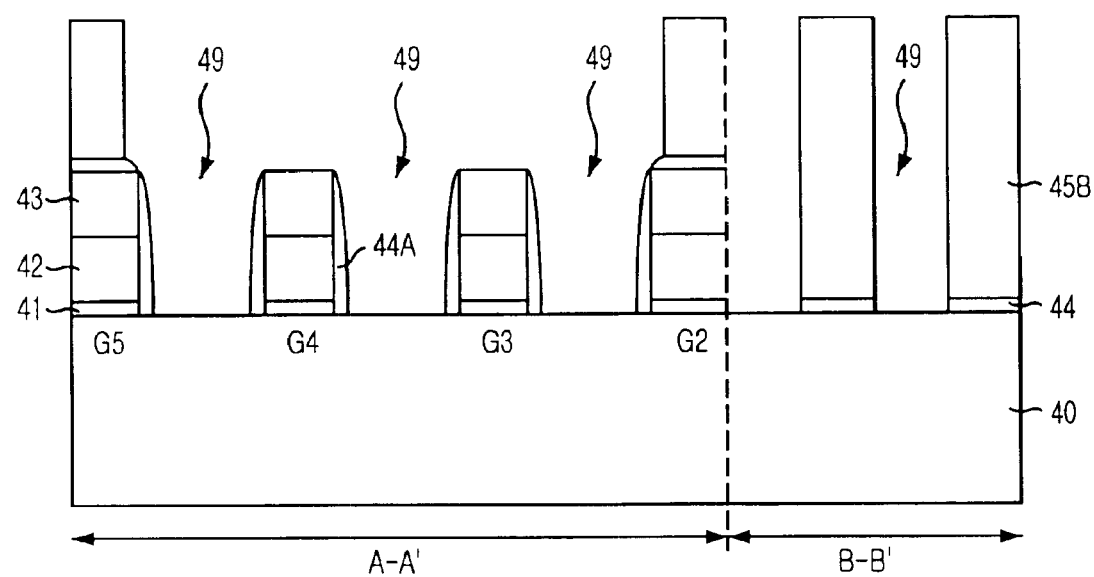

Referring to FIG. 5E, the exposed etch stop layer 44 is removed to expose the impurity diffusion regions. At this time, the etch stop layer 44 disposed on sidewalls of the gate structures G2 to G5 remains as a spacer denoted with a reference numeral 44A. Particularly, the removal of the exposed etch stop layer 44 proceeds by using an etch gas of $C_4F_6$, $O_2$ and Ar in order to minimize the shrinkage of the CD of the contact holes 49.

More specific to a preferable etch process recipe for the removal of the exposed etch stop layer 44, $C_4F_6$ gas, $O_2$ gas and Ar gas are proved in a range from approximately 5 sccm to approximately 15 sccm, in a range from approximately 2 sccm to approximately 6 sccm and in a range from approximately 100 sccm to approximately 200 sccm, respectively. Also, a power of approximately 500 W and approximately 1000 W are provided to a chamber of which inner wall temperature ranges from approximately 40° C. to approximately 60° C. At this time, the chamber is also provided with a pressure ranging from approximately 20 mTorr to approximately 50 mTorr. Also, a temperature of an electrode ranges from approximately 0° C. to approximately 20° C.

Next, the photoresist pattern 47 is removed by employing a typical photoresist stripping process. If the anti-reflective coating layer 46 is made of an organic-based material which is also used for forming the photoresist pattern 47, the patterned anti-reflective coating layer 46A is also removed through the photoresist stripping process or an ashing process.

Afterwards, a wet cleaning process is performed with use of a cleaning solution such as buffered oxide etchant (BOE) or hydrofluoric acid (HF) in order to secure the CD of the contact holes 49 and remove etch remnants from the SAC etching process and a blanket etch process. Preferably, the wet cleaning process is carried out for approximately 1 second to approximately 200 seconds. In case of using HF as the cleaning solution, it is preferable to use diluted HF, obtained by mixing HF and water in a ratio of approximately 1 part of HF to approximately 50 parts to approximately 500 parts of water.

Although not illustrated, a conductive material for forming a plug is filled into the contact holes 49. Then a chemical mechanical polishing (CMP) process is performed until the gate hard mask 43 is exposed. From this CMP process, a plurality of plugs each being electrically connected with the impurity diffusion regions of the substrate 40 are formed and the gate hard mask 43 is planarized.

The conductive material for forming the plugs is made of polysilicon which is most commonly used. Also, it is possible to use a barrier metal layer of Ti and TiN along with polysilicon. It is still possible to use tungsten instead of polysilicon.

Also, the above described preferred embodiment of the present invention exemplifies the case of forming the contact holes with use of a magnetically enhanced reactive ion etching (MERIE) apparatus. However, it is still possible to proceed the above described sequential steps at a capacitive coupled plasma (CCP) etching apparatus. Especially, the CCP apparatus allows the above partial etching of the inter-layer insulation layer and the etching of the anti-reflective coating layer to be performed concurrently or in-situ.

Figure 6A:
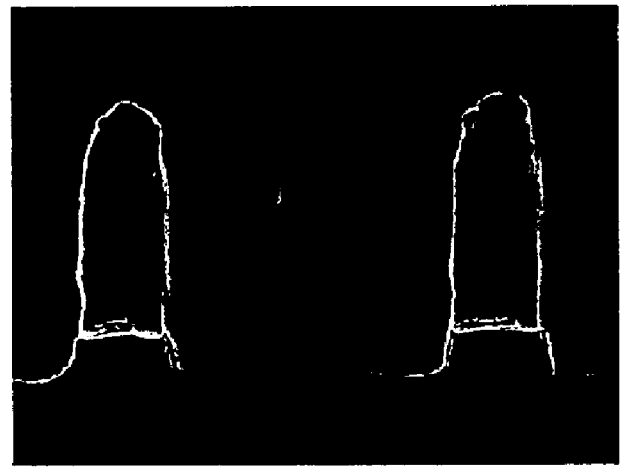
FIGS. 6A and 6B are micrographs of SEM respectively showing a cross-sectional view and a top view of a substrate structure obtained after an anti-reflective coating layer is formed with employing predetermined process recipes in accordance with the preferred embodiment of the present invention.
Figure 6B:
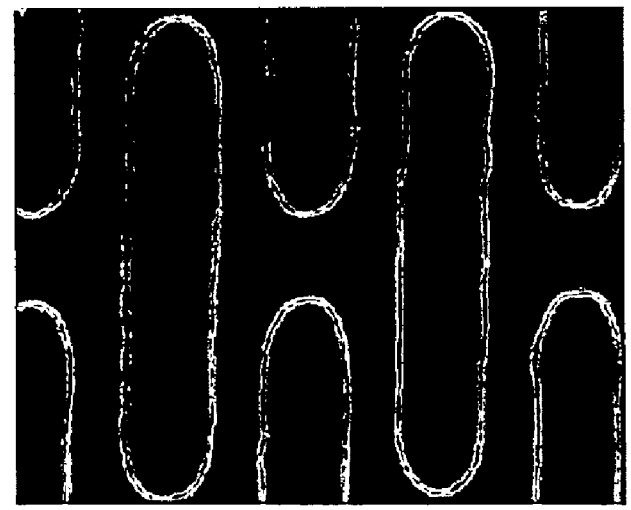

FIGS. 6A and 6B are micrographs of scanning electron microscopy (SEM) respectively showing a cross-sectional view and a top view of a substrate structure obtained after an anti-reflective coating layer is formed with employing process recipes in accordance with the preferred embodiment of the present invention.

More specific to the process recipes, one process recipe is a case of using an etch gas of $CF_4$, CO, $O_2$ and Ar, and the other process recipe is a case of using an etch gas of $CF_4$ and $O_2$. In case of using the former etch gas, a plasma etching process is employed with use of a mixed gas of $CF_4$, CO, $O_2$ and Ar. At this time, the $CF_4$, CO, $O_2$ and Ar gases are supplied with predetermined amounts of approximately 80 sccm, approximately 20 sccm, approximately 20 sccm, and approximately 150 sccm, respectively. Also, the plasma etching process proceeds at a chamber pressure of approximately 50 mTorr and a power of approximately 300 W along with maintaining an electrode temperature and a temperature of inner walls of a chamber at approximately 20° C. to approximately 50° C., respectively. Under these conditions, the plasma etching process is carried out for approximately 30 seconds.

Allowable ranges of the above described process recipe can be defined as follows. The $CF_4$ gas, the CO gas, the $O_2$ gas and Ar gas are supplied in a range from approximately 40 sccm to approximately 100 sccm, in a range from approximately 10 sccm to approximately 50 sccm, in a range from approximately 10 sccm to approximately 30 sccm and in a range from approximately 100 sccm to approximately 200 sccm, respectively. Also, the chamber pressure and the power are supplied in a range from approximately 30 mTorr to approximately 70 mTorr and in a range from approximately 200 W to approximately 400 W, respectively. Also, the temperature of the electrode and that of the inner walls are maintained in a range from approximately 0° C. to approximately 20° C. and in a range from approximately 40° C. to approximately 60° C., respectively. The etch time can be varied depending on a thickness of the anti-reflective coating layer.

In case of using the latter etch gas, a plasma etching process is employed with use of the etch gas of $CF_4$ and $O_2$ obtained by mixing approximately 100 sccm of the $CF_4$ gas and approximately 3 sccm of the $O_2$ gas, respectively. At this time, a chamber pressure, a power, an electrode temperature and a temperature of inner walls of a chamber are maintained at approximately 25 mTorr, approximately 500 W, approximately 20° C. and approximately 50° C., respectively.

Allowable ranges of the above described process recipe can be defined as follows. The $CF_4$ gas and the $O_2$ gas are in range from approximately 60 sccm to approximately 140 sccm and in a range from approximately 2 sccm to approximately 5 sccm, respectively. Also, the camber pressure, the power, the electrode temperature and that of the inner walls are maintained in a range from approximately 10 mTorr to approximately 50 mTorr, in a range from approximately 400 W to approximately 600 W, in a range from approximately 0° C. to approximately 20° C., and in a range from approximately 40° C. to approximately 60° C., respectively. The etch time can be varied depending on a thickness of the anti-reflective coating layer.

Figure 1A:
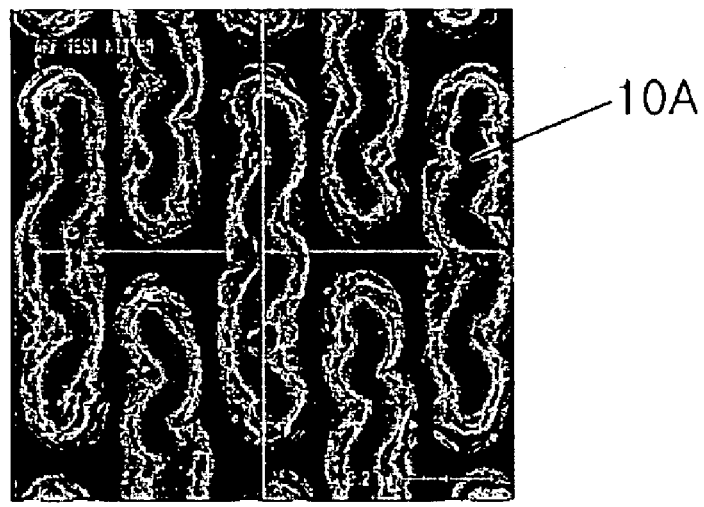
FIG. 1A is a micrograph of scanning electron microscopy (SEM) showing a defect in a photoresist pattern for use in ArF photolithography caused by a self-aligned contact (SAC) process.
Figure 1B:
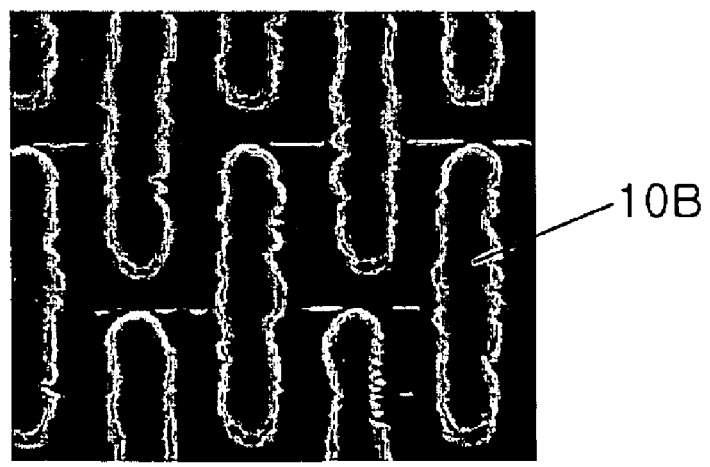
FIG. 1B is a micrograph of SEM showing another defect in a photoresist pattern for use in ArF photolithography caused by a SAC etching process.
Figure 2:
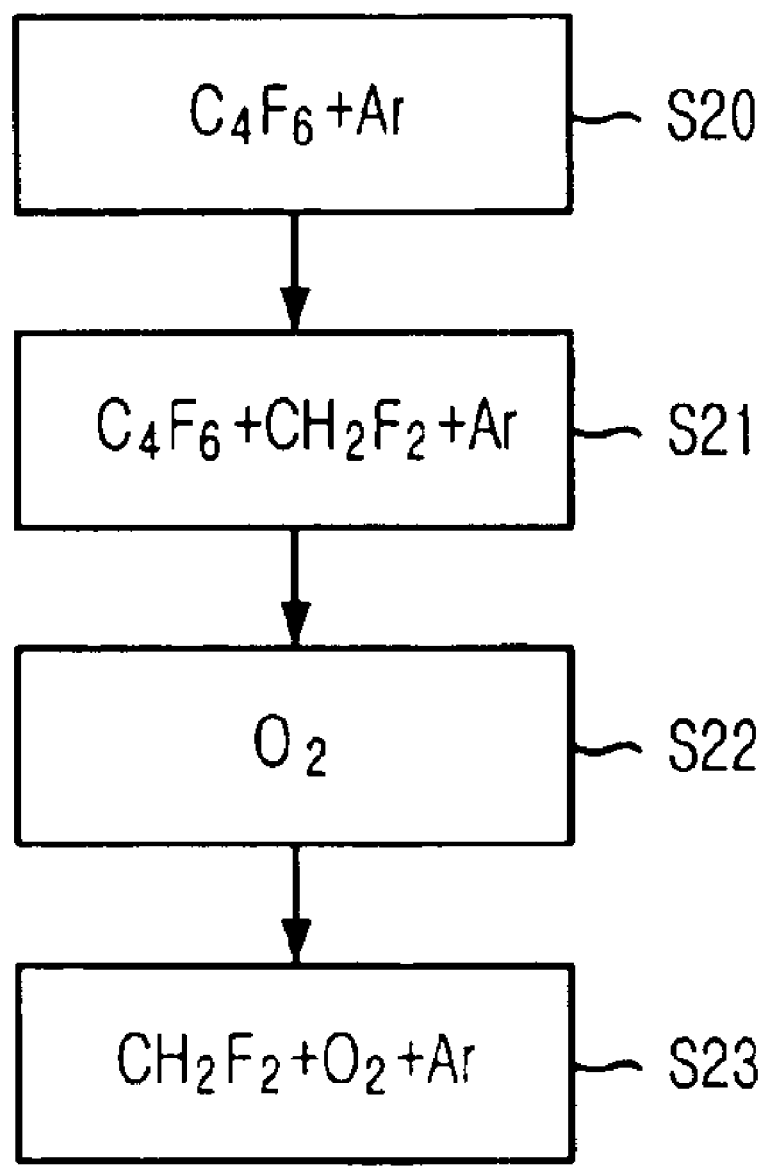
FIG. 2 is a flowchart showing sequential steps of a conventional SAC etching process.
Figure 3A:
FIGS. 3A and 3B are micrographs of SEM respectively showing a cross-sectional view and a top view of a substrate structure obtained after an anti-reflective coating layer formed on an inter-layer insulation layer is etched by employing a conventional process recipe.
Figure 3B:

As shown in FIGS. 6A and 6B, compared with the conventional method as described in FIGS. 3A and 3B, there are less shrunken or broken photoresist patterns by employing the above two described process recipes.

Figure 7:
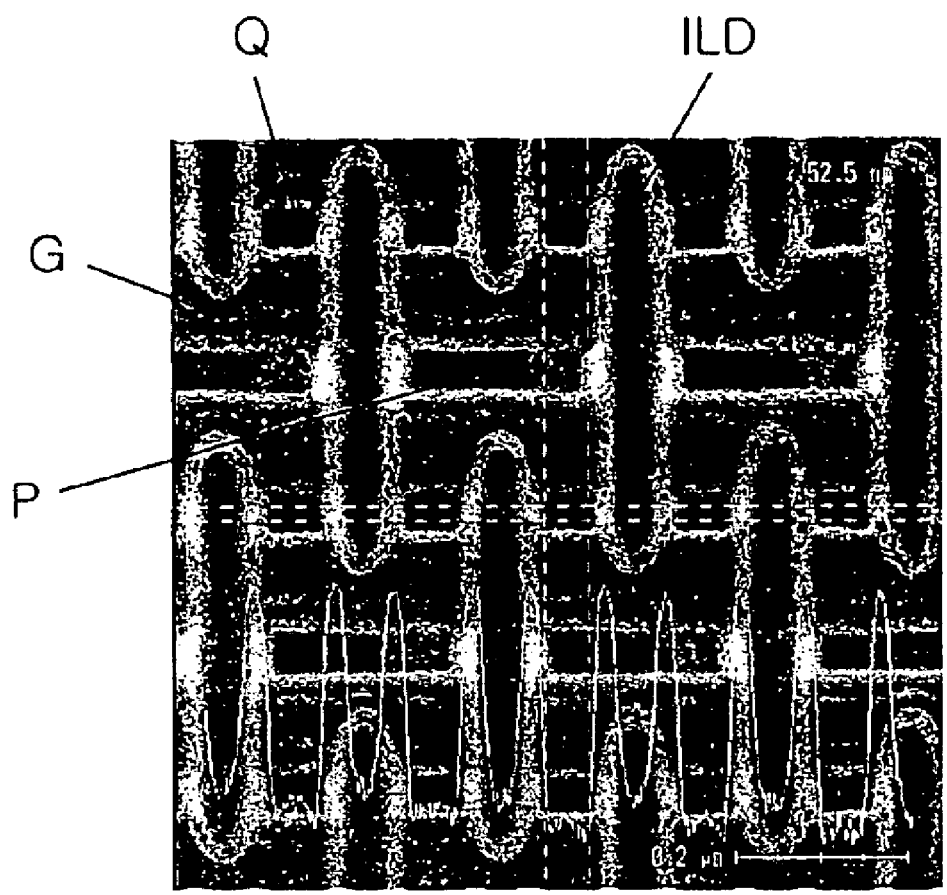
FIG. 7 is a micrograph of SEM showing a top view of a substrate structure obtained after a wet cleaning process followed by a contact hole formation process is performed with use of predetermined process recipes in accordance with the preferred embodiment of the present invention.

FIG. 7 is a micrograph of SEM showing a top view of a substrate structure obtained after a wet cleaning process followed by a contact hole formation process with employing process recipes in accordance with the preferred embodiment of the present invention. At this time, a magnetically enhanced ion etching (MERIE) apparatus is used, and the cleaning process proceeds for approximately 100 seconds by using a diluted HF-based cleaning solution.

As shown, a plurality of gate structures G are arranged with a predetermined distance, and in a crossing direction to the gate structures G, there is an inter-layer insulation layer ILD patterned by performing a SAC etching process. Among a plurality of contact holes P and Q confined between the patterned inter-layer insulation layers ILD, a group of the contact holes P are arranged in a crossing direction to another group of the contact holes Q with the gate structure G in between these groups. Particularly, the formerly mentioned contact holes P are regions to which bit lines will be contacted, while the latterly contact holes Q are regions to which storage nodes will be contacted.

In more detail of the process recipes for forming the above substrate structure, at the step of forming an anti-reflective coating layer, an etch gas of Ar, $CF_4$, $O_2$ and CO is used. At this time, the used amount of Ar, $CF_4$, $O_2$ and CO are approximately 500 sccm, approximately 80 sccm, approximately 20 sccm, and approximately 20 sccm, respectively. Also, a chamber pressure, a power, an electrode temperature, and a temperature of inner walls of a chamber are maintained at approximately 50 mTorr, approximately 300 W, approximately 15° C., and approximately 50° C., respectively.

At the step of selectively etching the inter-layer insulation layer ILD under the purpose of obtaining a vertical etch profile, an etch gas of $CF_4$ and $O_2$ is used. At this time, approximately 100 sccm of $CF_4$ gas and approximately 3 sccm of $O_2$ gas are used. Also, a chamber pressure, a power, and an electrode temperature are maintained at approximately 25 mTorr, approximately 500 W and approximately 15° C., respectively.

At the step of removing the inter-layer insulation layer, which is called a main etching step, an etch gas of $C_4F_6$, $CH_2F_4$, Ar and $O_2$ is used. At this time, approximately 10 sccm of $C_4F_6$ gas, approximately 3 sccm of $CH_2F_4$ gas, approximately 400 sccm of Ar gas, and approximately 4 sccm of $O_2$ gas are used. Also, a chamber pressure, a power and an electrode temperature are maintained at approximately 70 mTorr, approximately 600 W and approximately 15° C., respectively.

At the step of removing an etch stop layer, an etch gas of $C_4F_6$, Ar and $O_2$ are used. This etch gas is obtained by mixing approximately 10 sccm of $C_4F_6$ gas, approximately 400 sccm of Ar gas and approximately 4 sccm of $O_2$ gas, respectively. Also, a chamber pressure, a power and an electrode temperature are maintained at approximately 70 mTorr, approximately 600 W and approximately 15° C., respectively.

Compared with the conventional SAC etching process along with use of a KrF photoresist, the SAC etching process employed for forming a fine pattern with use of the ArF photoresist can be performed with the decreased number of steps in accordance with the preferred embodiment of the present invention. Also, an electrode and inner walls of a chamber are maintained with predetermined temperatures in accordance with the preferred embodiment of the present invention. Thus, it is possible to control generation of polymers during the SAC etching process and minimize pattern deformation. As a result of these effects, it is further possible to make an improvement on yields of semiconductor devices.

Although the preferred embodiment of the present invention exemplifies the use of T-type photoresist pattern for the SAC etching process, it is still possible to use a line type photoresist pattern or a hole type photoresist pattern for the SAC etching process. Also, in addition to the contact hole formation between the gate structures, the SAC etching process can be applied to a storage node contact hole formation process or a via hole formation process. In addition, the contact hole pattern as described in the preferred embodiment of the present invention can be used to form a metal wire contact, a bit line contact, a storage node contact and a contact pad.

The present application contains subject matter related to the Korean patent application No. KR 2003-0085816, filed in the Korean Patent Office on Nov. 28, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising the steps of:
 (a) forming a plurality of conductive structures on a substrate;
 (b) forming an etch stop layer on a substrate structure including the substrate and the conductive structures;

(c) forming an inter-layer insulation layer on the etch stop layer;

(d) sequentially forming an anti-reflective coating layer and a photoresist pattern on the inter-layer insulation layer;

(e) etching the anti-reflective coating (ARC) layer by employing the photoresist pattern as an etch mask along with use of an etch gas of $CF_4$, $O_2$, CO and Ar;

(f) etching a portion of the inter-layer insulation layer by employing the photoresist pattern and the ARC layer as an etch mask along with use of an etch gas of $CF_4$ and $O_2$;

(g) etching the inter-layer insulation layer by employing the photoresist pattern and the ARC layer as an etch mask along with use of an etch gas of $C_4F_6$, $CH_2F_2$, $O_2$ and Ar to thereby form at least one contact hole exposing the etch stop layer; and (h) removing the exposed etch stop layer.

2. The method of claim 1, wherein the step (d) proceeds by employing an ArF photolithography process.

3. The method of claim 1, wherein the steps from (e) to (h) proceed by using a magnetically enhanced reactive ion etching (MERIE) apparatus.

4. The method of claim 1, wherein the steps from e) to (h) proceed by using a capacitive coupled plasma (CCP) etching apparatus.

5. The method of claim 1, wherein the ARC layer is made of an organic-based material.

6. The method of claim 1, wherein the step (e) proceeds by employing a process recipe of providing the etch gas of $CF_4$, CO, $O_2$ and Ar with a respective predetermined amount ranging from approximately 40 sccm to approximately 100 sccm, ranging from approximately from 10 sccm to approximately 50 sccm, ranging from approximately 10 sccm to approximately 30 sccm, and ranging from approximately 100 sccm to approximately 200 sccm along with maintenance of a chamber pressure ranging from approximately 30 mTorr to approximately 70 mTorr, a power ranging from approximately 200 W to approximately 400 W, an electrode temperature ranging from approximately 0° C. to approximately 20° C. and a temperature of inner walls of a chamber ranging from approximately 40° C. to approximately 60° C.

7. The method of claim 1, wherein the inter-layer insulation layer is made of an oxide-based material.

8. The method of claim 1, wherein the step (f) proceeds by employing a process recipe of providing the etch gas of $CF_4$, and $O_2$ with a respective predetermined amount ranging from approximately 50 sccm to approximately 150 sccm and ranging from approximately from 1 sccm to approximately 5 sccm along with maintenance of a chamber pressure ranging from approximately 10 mTorr to approximately 50 mTorr, a power ranging from approximately 300 W to approximately 700 W, an electrode temperature ranging from approximately 0° C. to approximately 20° C. and a temperature of inner walls of a chamber ranging from approximately 40° C. to approximately 60° C.

9. The method of claim 1, wherein the step (g) proceeds by employing a process recipe of providing the etch gas of $C_4F_6$, $O_2$, Ar and $CH_2F_2$ with a respective predetermined amount ranging from approximately 5 sccm to approximately 15 sccm, ranging from approximately from 2 sccm to approximately 6 sccm, ranging from approximately 500 sccm to approximately 1500 sccm and ranging from approximately 2 sccm to approximately 5 sccm along with maintenance of a chamber pressure ranging from approximately 50 mTorr to approximately 100 mTorr, a power ranging from approximately 500 W to approximately 1000 W, an electrode temperature ranging from approximately 0° C. to approximately 20° C. and a temperature of inner walls of a chamber ranging from approximately 40° C. to approximately 60° C.

10. The method of claim 1, wherein the photoresist pattern is formed in one of T-type, line type and hole type.

11. The method of claim 1, wherein the conductive structure is one of a gate structure, a bit line structure and a metal wire.

12. A method for fabricating a semiconductor device, comprising the steps of:

(a) forming a plurality of conductive structures on a substrate;

(b) forming an etch stop layer on a substrate structure including the conductive structures and the substrate;

(c) forming an inter-layer insulation layer on the etch stop layer;

(d) sequentially forming an anti-reflective coating (ARC) layer and a photoresist pattern on the inter-layer insulation layer;

(e) etching the ARC layer and a portion of the inter-layer insulation layer by employing the photoresist pattern as an etch mask along with use of an etch gas of $CF_4$ and $O_2$;

(f) etching the inter-layer insulation layer by employing the photoresist pattern and the ARC layer as an etch mask along with use of an etch gas of $C_4F_6$, $CH_2F_2$, $O_2$ and Ar to thereby form at least one contact hole exposing the etch stop layer; and (g) removing the exposed etch stop layer.

13. The method of claim 12, wherein the step (d) proceeds by employing an ArF photolithography process.

14. The method of claim 12, wherein the steps from (e) to (g) proceed at a CCP etching apparatus.

15. The method of claim 12, wherein the ARC layer is made of an organic-based material.

16. The method of claim 12, wherein the step (e) of etching the ARC layer proceeds by employing a process recipe of providing the etch gas of $CF_4$ and $O_2$ with a respective predetermined amount ranging from approximately 60 sccm to approximately 140 sccm and ranging from approximately from 2 sccm to approximately 5 sccm along with maintenance of a chamber pressure ranging from approximately 10 mTorr to approximately 50 mTorr, a power ranging from approximately 400 W to approximately 600 W, an electrode temperature ranging from approximately 0° C. to approximately 20° C. and a temperature of inner walls of a chamber ranging from approximately 40° C. to approximately 60° C.

17. The method of claim 12, wherein the inter-layer insulation layer is made of an oxide-based material.

18. The method of claim 12, wherein the step (e) of etching the portion of the inter-layer insulation layer proceeds by employing a process recipe of providing the etch gas of $CF_4$, and $O_2$ with a respective predetermined amount ranging from approximately 50 sccm to approximately 150 sccm and ranging from approximately from 1 sccm to approximately 5 sccm along with maintenance of a chamber pressure ranging from approximately 10 mTorr to approximately 50 mTorr, a power ranging from approximately 300 W to approximately 700 W, an electrode temperature ranging from approximately 0° C. to approximately 20° C. and a temperature of inner walls of a chamber ranging from approximately 40° C. to approximately 60° C.

19. The method of claim 12, wherein the step (f) proceeds by employing a process recipe of providing the etch gas of $C_4F_6$, $O_2$, Ar and $CH_2F_2$ with a respective predetermined amount ranging from approximately 5 sccm to approximately 15 sccm, ranging from approximately from 2 sccm to approximately 6 sccm, ranging from approximately 500 sccm to approximately 1500 sccm and ranging from approximately 2 sccm to approximately 5 sccm along with maintenance of a chamber pressure ranging from approximately 50 mTorr to approximately 100 mTorr, a power ranging from approximately 500 W to approximately 1000 W, an electrode temperature ranging from approximately 0° C. to approximately 20° C. and a temperature of inner walls of a chamber ranging from approximately 40° C. to approximately 60° C.

20. The method of claim 12, wherein the photoresist pattern is formed in one of T-type, line type and hole type.

21. The method of claim 12, wherein the conductive structure is one of a gate structure, a bit line structure and a metal wire.

22. The method of claim 12, wherein the steps from (e) to (g) proceed at a MERIE apparatus.

* * * * *